(12) United States Patent
Kurisu

(10) Patent No.: US 6,320,413 B1
(45) Date of Patent: Nov. 20, 2001

(54) LEVEL CONVERSION CIRCUIT

(75) Inventor: Masakazu Kurisu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/580,576

(22) Filed: May 30, 2000

(30) Foreign Application Priority Data

May 28, 1999 (JP) .................................................. 11/150115

(51) Int. Cl.⁷ .............................................. H03K 19/018
(52) U.S. Cl. .................................. 326/73; 326/68; 326/80
(58) Field of Search .................................. 326/63, 64, 66, 326/68, 73, 77, 80, 81, 83, 86

(56) References Cited

U.S. PATENT DOCUMENTS

| | | | |
|---|---|---|---|
| 4,891,535 | * | 1/1990 | Ehteridge ................................ 326/73 |
| 5,214,328 | * | 5/1993 | Ohi ........................................ 326/66 |
| 5,754,059 | * | 5/1998 | Tanghe et al. ........................ 326/77 |
| 6,127,847 | * | 10/2000 | Sirna et al. ............................ 326/77 |

FOREIGN PATENT DOCUMENTS

| | | |
|---|---|---|
| 4-286419 | 10/1992 | (JP) . |
| 5-211433 | 9/1993 | (JP) . |
| 6-196995 | 7/1994 | (JP) . |
| 7-131330 | 5/1995 | (JP) . |
| 9-46210 | 2/1997 | (JP) . |
| 10-13209 | 1/1998 | (JP) . |

\* cited by examiner

*Primary Examiner*—Michael Tokar
*Assistant Examiner*—Don Phu Le
(74) *Attorney, Agent, or Firm*—Young & Thompson

(57) ABSTRACT

A circuit for converting a negative ECL level to a positive CMOS level is formed by a level conversion circuit input terminal 4 for inputting a negative ECL level, a level shifter 5, one end of which is connected to the input terminal 4, a load 6 of the level shifter 5, one end of which is connected to the level shifter 5 and the other end of which is connected to a positive power supply VDD, and a positive ECL-CMOS level converter 7 for comparing a voltage that is level shifted by the level shifter 5 with a reference voltage Vref and converting to a CMOS level.

4 Claims, 3 Drawing Sheets

LEVEL CONVERSION CIRCUIT

BACKGROUND OF THE INVENTION

1. Field of the Invention

The present invention relates to a level conversion circuit, and more particularly to a level conversion circuit (input buffer circuit) that converts an output level from an ECL logic circuit or GaAs logic operating with a negative power supply to a level for a CMOS logic circuit operating with a positive power supply.

2. Background of the Invention

FIG. 5 shows an example of a level conversion circuit of this type in the prior art. An ECL logic circuit (emitter coupled logic circuit) 21 operates with a negative potential VEE (usually −5.2 V to −4.5 V). In contrast to this, a CMOS logic circuit 31 operates between a positive potential VDD (usually +5 V or +3.3 V) and ground. The output of an ECL logic circuit (for example, an open-collector output of an NPN bipolar transistor) 21 is connected to a termination voltage VTT (usually −2 V) via a transmission path 22 and a termination resistance 23. By doing this, ECL levels (usually a high level of −0.9 V and a low level of −1.7 V) appear at the node 24 between transmission path 22 and the termination resistance 23. The AC component obtained at the node 24 is transmitted to an input terminal 25, via a series-connected capacitor 26. The DC bias on the input terminal (usually approximately VDD−2 V) 25 is generated, for example, by dividing a voltage between VDD and ground, using resistances R1 and R2. In PECL-CMOS level conversion circuit 28, an input voltage converted to a positive ECL level (so-called PECL level) is compared with a reference voltage (usually approximately VDD−1.3 V) applied to a reference voltage input terminal 27, and a full-swing CMOS level between VDD and ground is output to the output terminal 29. By making an AC connection in this manner via a series-connected capacitor 26, the signal levels of an ECL logic circuit 21 operating with a negative potential VEE is converted to the signal levels of a CMOS logic circuit 31 operating with a positive potential VDD.

Because the configuration of a circuit of the PECL-CMOS converter 28 is known to persons versed in the art, it will not be described in detail herein.

Another example of a level conversion circuit of the past is the circuit shown in FIG. 6, which was disclosed in the Japanese unexamined Patent Publication (KOKAI) No.10-13209. In this prior art, in order to convert a signal level from an ECL logic circuit 21 operating with a negative potential to a signal level of a CMOS logic circuit 31 operating with a positive potential, the ECL signal is input to a differential circuit that is formed by NPN bipolar transistors (Q1 and Q2), a constant-current source 32, and a load resistance (R3). The output from the load resistance (R3) of the differential circuit is connected to the gate electrode of a pMOS transistor (M3), the source electrode of which is connected to VDD and the drain electrode of which is connected to a resistance (R4). Additionally, the collector electrode of the transistor (Q2) is connected to the drain electrode of the transistor (M3). When transistor (Q2) is off, the transistor (M3) and (R4) operate as a VDD-grounded inverter circuit, the output level of which rises to nearly VDD. When the transistor (Q2) is on, resistance (R4) is pulled down to the ground, so that the output level falls to nearly ground level. Ultimately, the signal levels of an ECL logic circuit 21 operating with a negative potential VEE is converted to the signal levels of a CMOS logic circuit 31 having a full swing CMOS level between a positive potential VDD and ground level.

A first problem associated with the above-noted circuit of the past, however, is that, as shown in FIG. 5, when AC connection is made via a capacitor, the signal being transferred is restricted. That is, it is necessary to process a signal so as to maintain at a mark ratio of 50% in a scrambled signal or an 8B10 coded signal.

The reason for this is that, if the same code level (for example, the logical 0 level) is maintained continuously for a time period that is approximately the same as the RC time constant established by the capacitance of capacitor 26 and the termination resistance 23, the input voltage to the PECL-CMOS level converter reaches the self-bias voltage level, making logical discrimination impossible.

A second problem associated with the above-noted prior art is that, as shown in FIG. 6, while the use of a DC connection solves the first problem described above, a negative power supply must also be applied to the level conversion circuit. Therefore, when using the above-noted circuit as an ASIC input buffer, it is necessary to give special consideration to the application of the positive and negative power supplies (for example, power supply distribution, ESD protection between power supplies, and power-on sequencing restrictions), so that the circuit as shown in FIG. 6 is not suited for standard ASIC design methods.

The third problem is that, in the second prior art shown in FIG. 6, a BiCMOS process is necessary, this generally having a manufacturing cost that is higher than that of a CMOS process.

Accordingly, it is an object of the present invention to improve the above-noted problems of the prior art, by providing a novel level conversion circuit capable of signal transmission from DC, which does not require the application of a negative power supply, which can be implemented using a CMOS process, which is suited for standard ASIC design methods, and which converts the signal levels of an ECL logic circuit operating with a negative potential VEE to the signal levels of a CMOS logic circuit operating with a positive potential VDD.

SUMMARY OF THE INVENTION

In order to achieve the above-noted object, the present invention has the following technical constitution.

Specifically, a first aspect of a level conversion circuit according to the present invention is a level conversion circuit for converting a negative ECL level to a positive CMOS level, having a level conversion circuit input terminal that inputs the negative ECL level, a level shifter, one end of which is connected to the input terminal, a load of the level shifter, one end of which is connected to the level shifter and the other end of which is connected to a positive power supply, and a positive ECL-CMOS level converter, which compares a voltage that is level shifted by the level shifter with a reference voltage and converts to a CMOS level.

In a second aspect of the present invention, the level shifter is implemented as an nMOS transistor with a shorted gate electrode and drain electrode, and the load is implemented as a pMOS transistor, the gate electrode of which is connected to ground, and the source electrode of which is connected to the positive power supply.

In a third aspect of the present invention, a plurality of nMOS transistors having a shorted gate and drain electrode are connected in series to make up the level shifter.

In a fourth aspect of the present invention, the level shifter is implemented by a PN junction diode, and the load is implemented by a pMOS transistor, the gate electrode of which is connected to ground, and the source electrode of which is connected to the positive power supply.

In a fifth aspect of the present invention, a plurality of the PN junction diodes are connected in series to form the level shifter.

A sixth aspect of the present invention is provided with a reference voltage input terminal, a second level shifter, one end of which is connected to the reference voltage input terminal, and a second load of the second level shifter, one end of which is connected to the second level shifter, and the other end of which is connected to a positive power supply, wherein a voltage that is level shifted by the second level shifter is used as the reference voltage of the positive ECL-CMOS level shifter.

BRIEF DESCRIPTIONS OF THE DRAWINGS

DETAILED DESCRIPTION OF THE PREFERRED EMBODIMENTS

Embodiments of the present invention are described in detail below, with reference made to relevant accompanying drawings.

Figure 1:
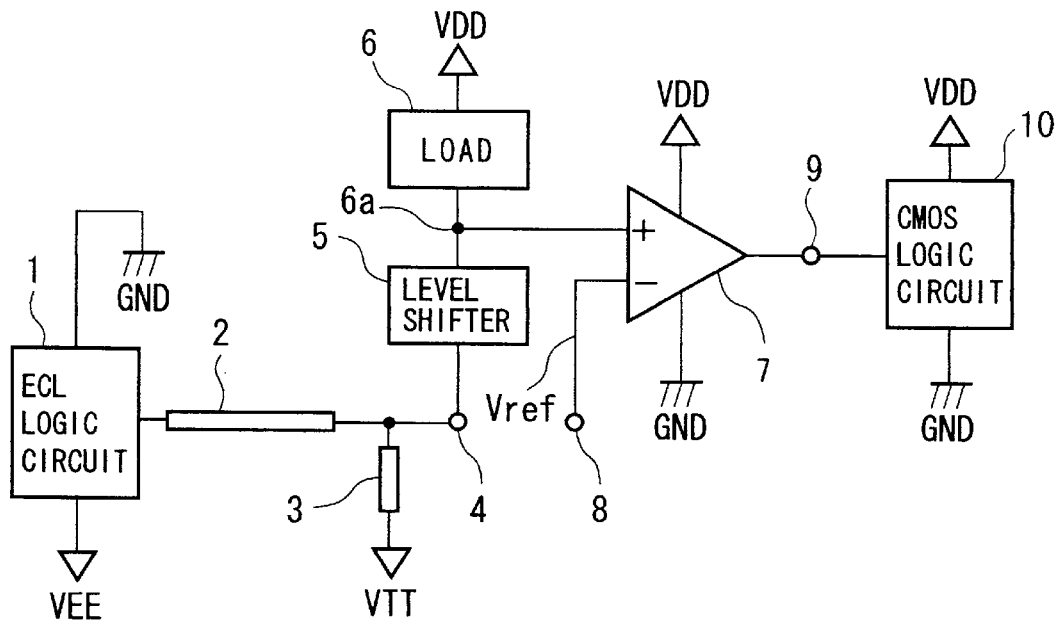
FIG. 1 is a block diagram showing the configuration of a level conversion circuit according to the present invention.

Referring to FIG. 1, an embodiment of the present invention is formed by an ECL logic circuit 1, a transmission path 2, a termination resistance 3, an input terminal 4, a level shifter 5, a load 6 of the level shifter 5, a PECL-CMOS level converter 7, a reference voltage input terminal 8 of the PECL-CMOS level converter 7, an output terminal 9 of the PECL-CMOS level converter 7, and a CMOS logic circuit 10.

The ECL logic circuit 1 operates with a negative potential VEE. The CMOS logic circuit 10 operates with a positive potential VDD. The output of the ECL logic circuit 1 is connected to the input terminal 4 of the level converter, via the transmission path 2. One end of the transmission path 4 is connected to a termination voltage VTT via a termination resistance 3 having a resistance value that is equal to the characteristic impedance of the transmission path 2, thereby suppressing signal reflections caused by impedance mismatching, and enabling high-speed signal transmission.

At the level shifter 5, one end of which is connected to the input terminal 4, a received signal is level shifted to the positive potential VDD. The output of the level shifter 5 is input to a load 6, the other end of which is connected to VDD, and a PECL level appears at the node 6a between the level shifter 5 and the load 6. In response to this, at the PECL-CMOS level converter 7, a comparison is made between a reference voltage applied to the reference voltage input terminal 8 and the PECL input signal appeared at the node 6a, and conversion is made to a full-swinging CMOS level between VDD and ground. Thus, the signal levels of an ECL logic circuit operating with a negative potential VEE is converted to the signal levels of a CMOS logic circuit operating with a positive potential VDD.

Figure 2:
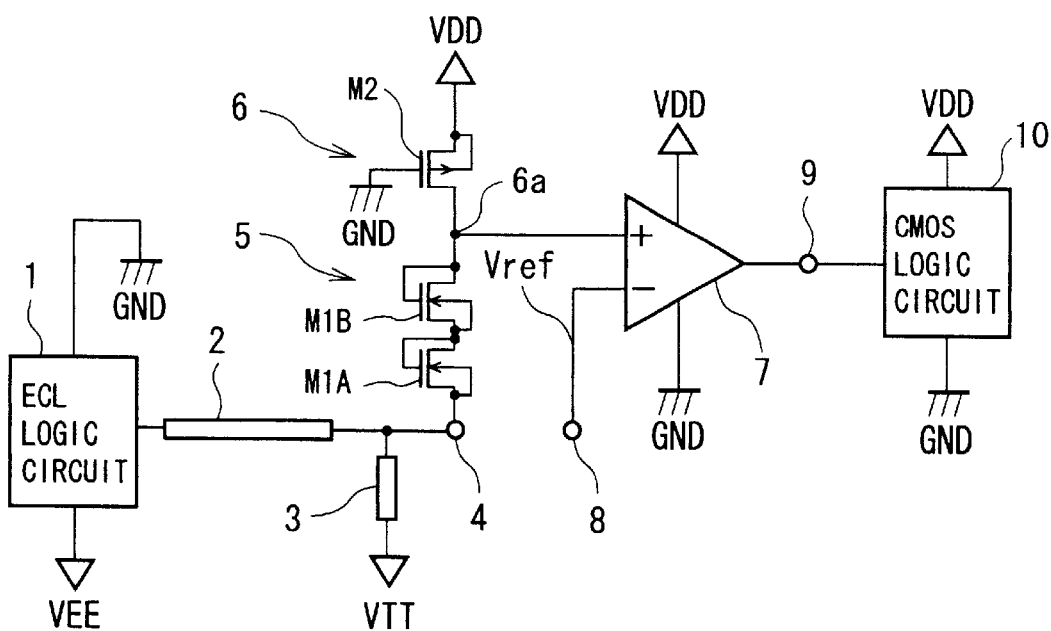
FIG. 2 is a level conversion circuit according to a first embodiment of the present invention.

FIG. 1 and FIG. 2 are circuit diagrams showing a first embodiment of a level conversion circuit according to the present invention.

These drawings show a level conversion circuit for converting a negative ECL level to a positive CMOS level, this conversion circuit being formed by an input terminal 4 of the level conversion circuit for inputting a negative ECL signal, a level shifter 5, one end of which is connected to the input terminal 4, a load 6, one end of which is connected to the level shifter 5, and the other end of which is connected to the positive power supply VDD, and a positive ECL-CMOS level converter 7, which compares a voltage that is level shifted by the level shifter 5 with a reference voltage Vref, and converts it to a CMOS level.

The level shifter 5 is formed by nMOS transistors M1A and M1B, the gate and drain electrodes of which are connected, respectively, and the load 6 is formed by a pMOS transistor M2, the gate electrode of which is connected to ground, and the source electrode of which is connected to the positive power supply VDD.

Furthermore, in FIG. 2, a plurality of nMOS transistors with shorted gate and drain electrodes are connected in series in the level conversion circuit of the present invention.

The above-noted level conversion circuit is formed on one and the same semiconductor chip as a CMOS logic circuit is fabricated, and the semiconductor chip is formed by a CMOS process.

The first embodiment of the present invention is described in further detail below, with reference made to FIG. 2.

The ECL logic circuit 1 operates with a negative power supply VEE (for example, −5.2 V). The CMOS logic circuit 10 operates with a positive power supply VDD (for example, +3.3 V). The output of the ECL logic circuit (for example, the open-collector output of an NPN bipolar transistor) 1 is connected to a termination voltage VTT (usually approximately −2 V) via a transmission path 2 and a termination resistance 3. By doing this, an ECL level (usually a high level of −0.9 V and a low level of −1.7 V) appears at the input terminal 4. The level shifter 5 formed by the transistors M1A and M1B, the gate and drain electrodes of which are connected, respectively, shift the level of the ECL level applied to the input circuit 4 toward VDD. At the node 6a between the drain of the pMOS transistor M2 with a gate electrode connected to ground and a drain electrode connected to VDD and the drain of the nMOS transistor M1B of the level shifter 5, a PECL level (usually with a high level of VDD−0.9 V, a low level of approximately VDD−1.7 V) is generated. At the PECL-CMOS level converter 7, a comparison is made between this PECL level and a reference voltage Vref (usually approximately VDD−1.3 V) applied to the reference voltage input terminal 8, and a full-swinging CMOS signal is output to the output terminal 9. In this embodiment, it is necessary that the total equivalent resistance value of the load 6 and the level shifter 5 be sufficiently larger than the termination resistance 3 of, for example, 50 Ω (for example, 10 times the termination resistance 3), so that a current that flows via the load 6 and the level shifter 5 from VDD into the input terminal 4 does not adversely affect the ECL level applied to the input terminal 4. Additionally, in order to suppress attenuation of the amplitude (usually approximately 0.8 V) of the ECL level signal applied to the input terminal 4 and convert to a PECL level without a worsening of level conversion sensitivity, it is necessary that the equivalent resistance of the load 6 be made sufficiently larger than the equivalent resistance of the level shifter 5 (for example, 5 to 10 times the level shifter equivalent resistance).

Figure 3:
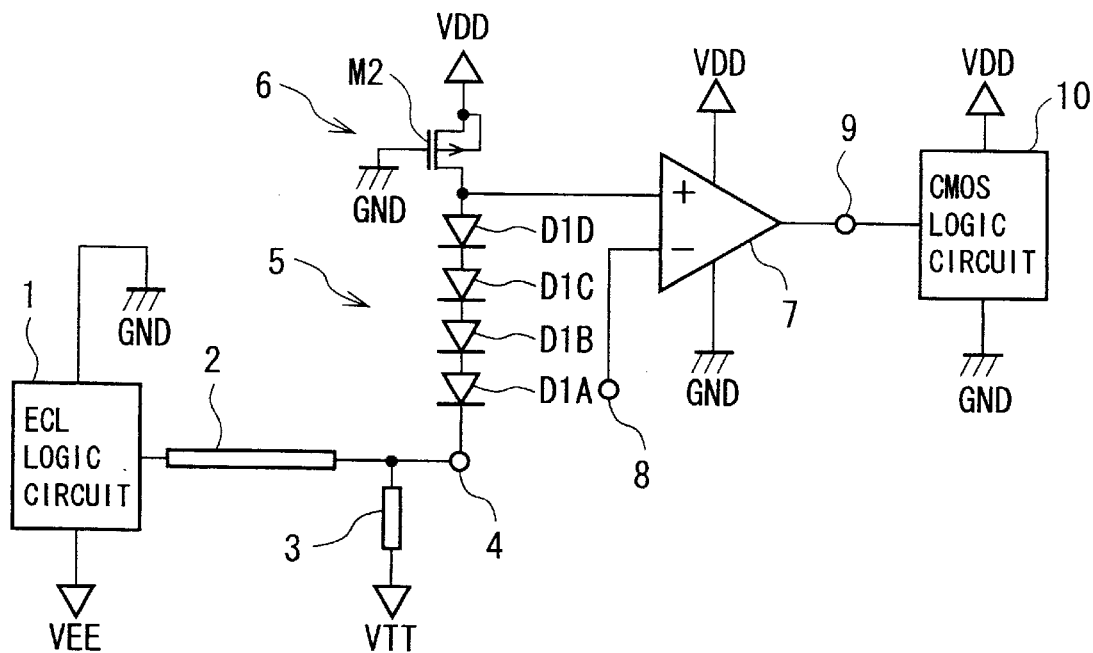
FIG. 3 is a level conversion circuit according to a second embodiment of the present invention.

FIG. 3 shows the second embodiment of a level conversion circuit according to the present invention, a level shifter 5 in the second embodiment is made up of PN junction diodes D1A to D1A, and the load 6 is formed by a pMOS transistor M2, the gate electrode of which is connected to ground, and the source electrode of which is connected to a positive power supply VDD.

Furthermore, a plurality of PN junction diodes are connected in series to form the level shifter.

The second embodiment is described in further detail below.

Similar to the case of the first embodiment, an ECL level (usually with a high level of −0.9 V, a low level of −1.7V) is input to the input terminal 4. At the level shifter 5, comprising series-connected PN junction diodes (D1A, D1B, D1C, D1A), the ECL level applied to the input terminal 4 is level shifted toward VDD. If the ON voltage of the PN junction diode is 0.8 V, the level shift is performed approximately 3.2 V toward VDD. That is, an ECL level having −1.3 V as a center value is converted to a PECL level having +1.9 V as a center value. At the PECL-CMOS level converter 7, a comparison is made between this PECL level and a reference voltage (+1.9 V) applied to the reference voltage input terminal 8, and a full-swing CMOS level is output to the output terminal.

Figure 4:
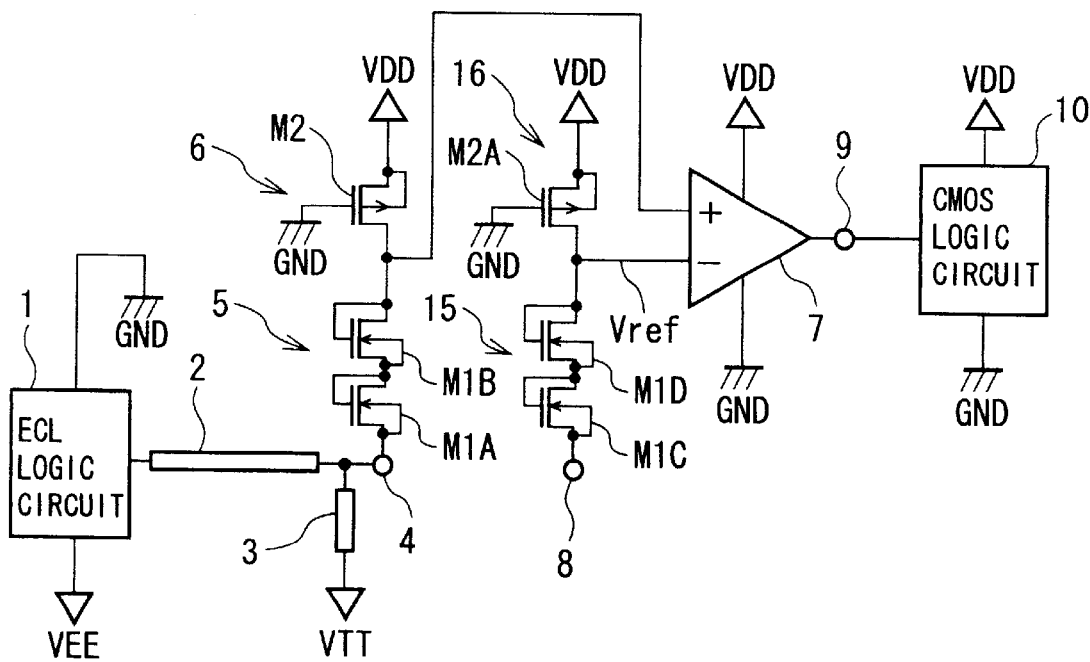
FIG. 4 is a level conversion circuit according to a third embodiment of the present invention.
Figure 5:
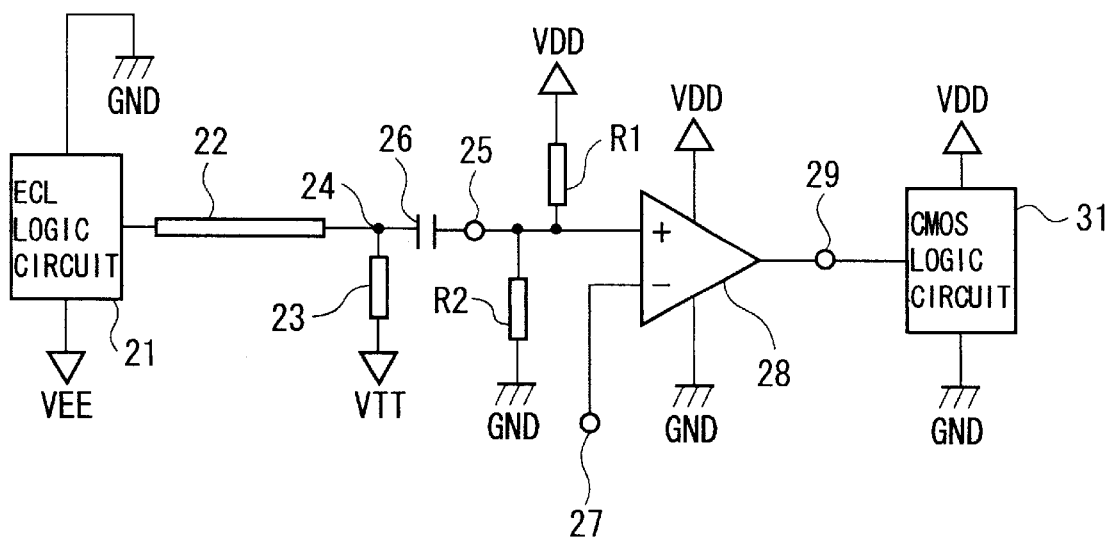
FIG. 5 is a level conversion circuit according to the first prior art example.
Figure 6:
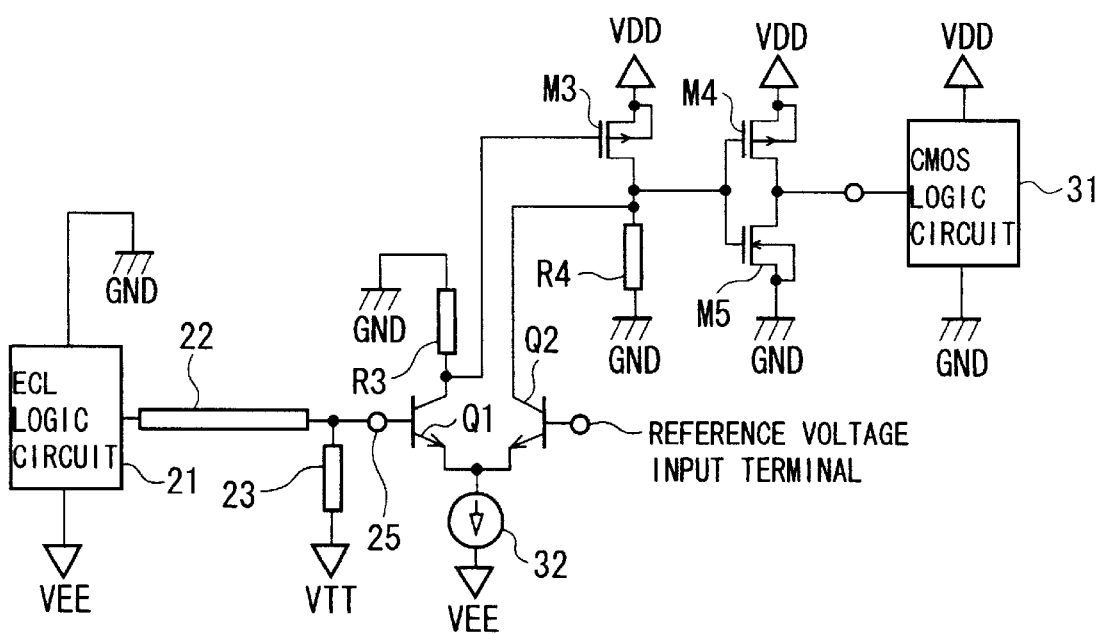
FIG. 6 is a level conversion circuit according to the second prior art example.

FIG. 4 shows the third embodiment of a level conversion circuit according to the present invention, which is a level conversion circuit provided with a reference voltage input terminal 8, a second level shifter 15, one end of which is connected to the reference voltage input terminal 8, and a second load 16 of the second level shifter 15, one end of which is connected to the second level shifter 15, and the other end of which is connected to a positive power supply VDD, wherein a voltage that is level shifted by the second level shifter 15 is used as the reference voltage of the positive ECL-CMOS level converter 7.

The third embodiment is described in further detail below.

Similar to the case of the first embodiment, an ECL level (usually with a high level of −0.9 , a low level of −1.7 V) is input to the input terminal 4. A difference of this embodiment with respect to the first embodiment is that a negative ECL level is applied to the level conversion circuit (M1C, M1D, M2A) formed by the second level shifter 15 and the load 16 connected in series therewith. By doing this, it is possible to use the ECL logic circuit reference voltage (usually −1.3 V) at the reference voltage input terminal 8, and there is no need to generated a new reference voltage for PECL.

If a complimentary ECL signal is input to the reference voltage input terminal 8, and the level conversion circuit is comprised with a differential configuration, there is an improvement in common-mode noise immunity, this being advantageous from the standpoint of enabling transmission of higher speed signals.

By adopting the constitution described above, a level conversion circuit according to the present invention achieves a number of effects.

The first effect is that it is not necessary to perform signal processing to maintain a mark ratio of 50%, that is, to balance DC levels, such as by scrambling the signal or performing 8B10B coding, thereby removing restrictions on the transmitted signal and the attendant overhead that would be incurred by such extra measures.

The second effect achieved is that the level conversion circuit of the present invention is suited for standard design methods for ASICs, such as gate arrays, thereby facilitating the fabrication of the above-noted level conversion circuit with a CMOS logic circuit as an ASIC input buffer.

The reason for this is that, although VTT is applied from the input terminal via the termination resistance, the level conversion circuit of the present invention does not require direct connection to a negative power supply VEE or VTT, thereby eliminating the need for power supply distribution, ESD protection between power supplies, and restrictions on the power-on sequence.

The third effect is that the present invention suppresses an increase in cost by using a standard digital CMOS process, without using the high-cost BiCMOS process.

What is claimed is:

1. A level conversion circuit for converting a negative ECL level to a positive CMOS level, comprising:
   a level conversion circuit input terminal for inputting said negative ECL level;
   a level shifter, one end of which is connected to said input terminal;
   a load for said level shifter, one end of which is connected to said level shifter and the other end of which is connected to a positive power supply; and
   a positive ECL-CMOS level converter, which compares a voltage that is level shifted by said level shifter with a reference voltage and converts to a CMOS level,
   wherein said level shifter comprises an nMOS transistor with a shorted gate electrode and drain electrode, and said load comprises a pMOS transistor, a gate electrode of which is connected to ground, and a source electrode of which is connected to said positive power supply.

2. A level conversion circuit according to claim 1, wherein a plurality of nMOS transistors having a shorted gate and drain electrode in said level shifter, are connected in series.

3. A level conversion circuit for converting a negative ECL level to a positive CMOS level, comprising:
   a level conversion circuit input terminal for inputting said negative ECL level;
   a level shifter, one end of which is connected to said input terminal;
   a load for said level shifter, one end of which is connected to said level shifter and the other end of which is connected to a positive power supply; and
   a positive ECL-CMOS level converter, which compares a voltage that is level shifted by said level shifter with a reference voltage and converts to a CMOS level,
   wherein said level shifter comprises a PN junction diode, and said load comprises a pMOS transistor, a gate electrode of which is connected to ground, and a source electrode of which is connected to said positive power supply.

4. A level conversion circuit according to claim 3, wherein a plurality of said PN junction diodes are connected in series to form said level shifter.

* * * * *